(12) United States Patent
Zhao et al.

(10) Patent No.: US 12,253,886 B2
(45) Date of Patent: Mar. 18, 2025

(54) FLEXIBLE DISPLAY DEVICE AND DISPLAY TERMINAL

(71) Applicant: BOE TECHNOLOGY GROUP CO., LTD., Beijing (CN)

(72) Inventors: Lijuan Zhao, Beijing (CN); Junhuan Liu, Beijing (CN); Lupeng Bian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/027,210

(22) PCT Filed: Jun. 29, 2022

(86) PCT No.: PCT/CN2022/102302
§ 371 (c)(1),
(2) Date: Mar. 20, 2023

(87) PCT Pub. No.: WO2024/000253
PCT Pub. Date: Jan. 4, 2024

(65) Prior Publication Data
US 2024/0310876 A1   Sep. 19, 2024

(51) Int. Cl.
*G06F 1/16* (2006.01)
(52) U.S. Cl.
CPC .......... *G06F 1/1652* (2013.01); *G06F 1/1656* (2013.01)
(58) Field of Classification Search
CPC .... G06F 1/1652; G06F 1/1656; G06F 1/1624; G06F 9/30; H05K 5/06
See application file for complete search history.

(56) References Cited

U.S. PATENT DOCUMENTS

| 10,747,269 | B1* | 8/2020 | Choi ..................... G06F 1/1641 |
| 10,871,797 | B1  | 12/2020 | Jo et al. |
| 11,016,532 | B2* | 5/2021 | Yang ................... H04M 1/0268 |
| 2006/0068859 | A1* | 3/2006 | Lee ..................... H04M 1/0237 |
| | | | 455/575.4 |
| 2021/0212221 | A1 | 7/2021 | Diboine et al. |
| 2022/0155823 | A1* | 5/2022 | Shin ....................... G09F 9/301 |
| 2022/0253103 | A1* | 8/2022 | Choi ...................... G09F 9/301 |
| 2023/0098597 | A1 | 3/2023 | Gao et al. |

FOREIGN PATENT DOCUMENTS

| CN | 112908169 A | 6/2021 |
| CN | 113085938 A | 7/2021 |
| CN | 113516920 A | 10/2021 |
| CN | 113554951 A | 10/2021 |
| CN | 114333607 A | 4/2022 |
| CN | 114446181 A | 5/2022 |
| TW | 202211184 A | 3/2022 |

\* cited by examiner

*Primary Examiner* — Abhishek M Rathod
(74) *Attorney, Agent, or Firm* — WHDA, LLP

(57) ABSTRACT

A flexible display device is provided, including: a housing, a flexible display screen, a support member and a sliding-roller. The support member is located between the flexible display screen and the sliding-roller, and is configured for driving the flexible display screen to be rolled on the sliding-roller. The sliding-roller is rotatable and is arranged in the housing. The flexible display device further includes a limiting structure provided between the support member and the housing for maintaining a gap between the flexible display screen and the housing. A display terminal is further provided.

18 Claims, 6 Drawing Sheets

FLEXIBLE DISPLAY DEVICE AND DISPLAY TERMINAL

CROSS-REFERENCE TO RELATED APPLICATIONS

The present application is the U.S. national phase of PCT Application No. PCT/CN2022/102302 filed on Jun. 29, 2022, the disclosure of which is hereby incorporated by reference in its entirety.

TECHNICAL FIELD

The present disclosure relates to the technical field of display product fabrication, and in particular, to a flexible display device and a display terminal.

BACKGROUND

With the development of display technologies, display devices are widely used nowadays, and the performance requirements for screens are gradually stricter. The flexible display screen has characteristics of bendable and rollable. By using the flexibility of the display device, a user can roll or fold the display device, thereby facilitating the user to carry and use the display device, therefore a design of sliding-rolling which combines both the folding and rolling is advantageous in appearance and applicability.

For the whole machine that is capacity of sliding and rolling, there is a larger display region in the screen and aesthetic appearance. However, with the flexible module included in the structure of the machine, the following issues may arise: the display module may be scratched due to a warping tail end of the display module, a high arch may be formed in the display module, and an unstable force may be applied to the display module.

SUMMARY

In order to address the above issues, the present disclosure provides a flexible display device and a display terminal, which can prevent issues such as the display module may be scratched due to the warping tail end of the display module.

In order to achieve this, embodiments of the present disclosure provide the following technical solutions. A flexible display device, including: a housing, a flexible display screen, a support member, and a sliding-roller, wherein the support member is located between the flexible display screen and the sliding-roller and is configured for driving the flexible display screen to be rolled on the sliding-roller, the sliding-roller is rotatable and is arranged in the housing, wherein the flexible display device further includes a limiting structure, provided between the support member and the housing for maintaining a gap between the flexible display screen and the housing.

Optionally, the limiting structure includes at least one rigid track arranged at a side of the support member away from the flexible display screen, the rigid track is wound around the sliding-roller to be in a U-shaped structure, and two opposite ends of the rigid track are fixed to the housing.

Optionally, in a rolling-up direction of the flexible display screen, the flexible display screen includes a first end adjacent to the sliding-roller, and when the flexible display screen is in a rolled-up state, an orthographic projection of the first end onto the rigid track is located in the rigid track.

Optionally, in a direction parallel to an axial direction of the sliding-roller, at least one rigid track is arranged at intervals in a middle region of the flexible display screen.

Optionally, in an extending direction of the rigid track, a plurality of connecting structures for connecting the rigid track is arranged at intervals on the support member.

Optionally, the connecting structure includes two L-shaped connecting members arranged oppositely in a first direction, the L-shaped connecting members include a first connecting rod connected to the support member and a second connecting rod being perpendicular to and connected with the first connecting rod, the first direction is parallel to the axial direction of the sliding-roller, an extending direction of the first connecting rod is perpendicular to a display surface of the flexible display screen, and an extending direction of the second connecting rod is parallel to the axial direction of the sliding-roller;

in a direction perpendicular to the display surface of the flexible display screen, a cross-section of the rigid track has an H-shape rotated by 90 degrees, the rigid track includes a first connecting plate and a second connecting plate, and a supporting plate connected between the first and second connecting plates, the first connecting plate being inserted between the two L-shaped connecting members.

Optionally, the connecting structure includes an inverted T-shaped structure which includes a third connecting rod and a fourth connecting rod connected with each other, one end of the third connecting rod is connected to the support member, the other end of the third connecting rod is connected to a middle part of the fourth connecting rod, an extending direction of the third connecting rod is perpendicular to the display surface of the flexible display screen, and an extending direction of the fourth connecting rod is parallel to the extending direction of the sliding-roller;

the rigid track is provided with an stripe-shaped groove extending in the extending direction of the rigid track, an opening of the stripe-shaped groove is provided on a connecting surface of the rigid track adjacent to the support member, the opening is a stripe-shaped opening extending in the extending direction of the rigid track and penetrating through the rigid track, and a width of the opening in a direction perpendicular to the extending direction of the rigid track is less than a length of the fourth connecting rod.

Optionally, the connecting structure includes two fifth connecting rods arranged opposite to each other and parallel with each other, the fifth connecting rods are arranged to be perpendicular to the display surface of the flexible display screen, and a rotatable connecting shaft is connected between the two fifth connecting rods;

the rigid track is extending between the connecting shaft and the support member.

Optionally, in a direction perpendicular to the axial direction of the sliding-roller, the support member includes a plurality of supporting bars arranged at intervals, an extending direction of the supporting bars is parallel to the axial direction of the sliding-roller, and at least some of the supporting bars are provided with the connecting structure.

Optionally, the connecting structure and the supporting bar is in a one-piece structure.

Optionally, an elongated clamping groove matching with the supporting bar is provided on an outer circumference surface of the sliding-roller, and at least one notch which is in one-to-one correspondence to the rigid track is arranged on each stripe-shaped groove to receive the rigid track.

Optionally, the support member is connected to the flexible display screen by an optical adhesive layer.

Optionally, the limiting structure includes a first magnetic structure and a second magnetic structure with same magnetic polarity, the first magnetic structure is arranged at a side of the support member away from the flexible display screen, and the second magnetic structure is arranged on the housing.

Optionally, the support member functions as the first magnetic structure.

Optionally, the flexible display screen includes a display region and a non-display region, the non-display region is wound on the sliding-roller, the display region is capable of being stretched out or retracted in when being driven by the sliding-roller, one side of the support member away from the flexible display screen includes a first region corresponding to the display region, the first region is provided with a supporting portion, and the supporting portion is provided with a third magnetic structure with a magnetic polarity opposite to the magnetic polarity of the first magnetic structure.

An embodiment of the present disclosure further provides a display terminal including the flexible display device as described above.

The present disclosure has the following advantages. With the arrangement of the limiting structure, a gap is always maintained between the flexible display screen and the housing, so as to prevent the tail end of the flexible display screen from tilting up to be contacted with the housing during the sliding and rolling process which may in turn causes a defect such as a scratch.

DETAILED DESCRIPTION

To make the objective, technical solution and advantages of embodiments of the present disclosure clear, a detailed description of the embodiments of the present disclosure will be given hereinafter in conjunction with the appended drawings. It is to be understood that the described embodiments are some, rather than all, of the embodiments of the disclosure. Based on the embodiments of the present disclosure, all other embodiments that would be readily conceived by one of ordinary skill in the art fall within the scope of the present disclosure.

In describing the present disclosure, It is to be noted that the terms "central", "upper", "lower", "left", "right", "vertical", "horizontal", "inner", "outer", and the like indicate orientations or position relationships based on the orientations or position relationships shown in the figures for the purpose of facilitating and simplifying description of the present disclosure, and such terms do not indicate or imply that the referenced devices or elements must have the particular orientation, be constructed and operated in the particular orientation, and thus such terms should not be construed as limiting the present disclosure. Furthermore, the terms "first", "second", and "third" are used for the purpose of illustration only, and are not to be interpreted as indicating or implying relative importance.

Figure 1:
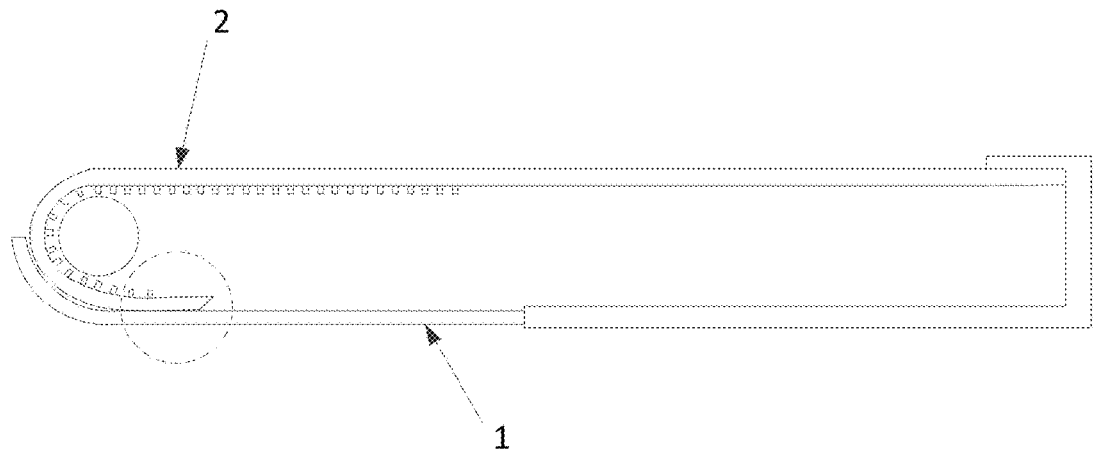
FIG. 1 is a schematic diagram showing a structure of a flexible display device in the related art.
Figure 2:
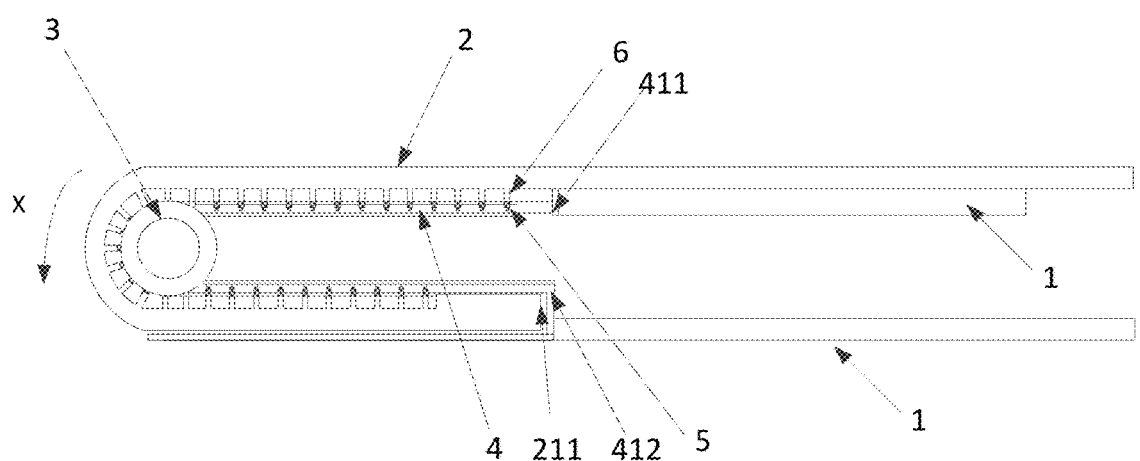
FIG. 2 is a first schematic diagram showing a structure of a flexible display device in an embodiment of the present disclosure.
Figure 12:
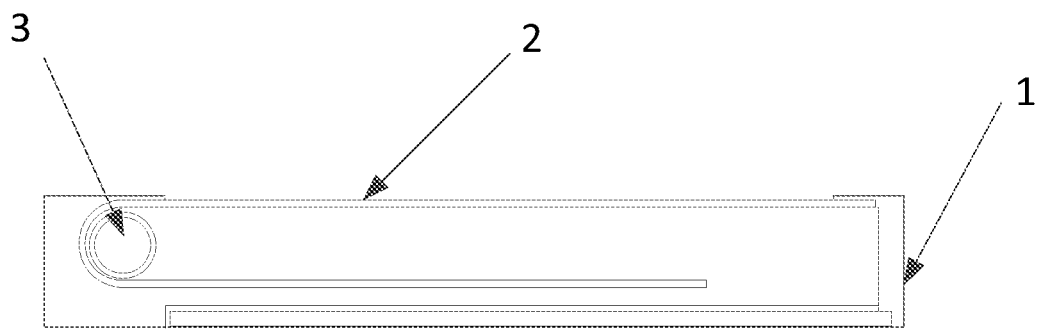
FIG. 12 is a schematic diagram showing a flexible display device in a rolled-up state.
Figure 13:
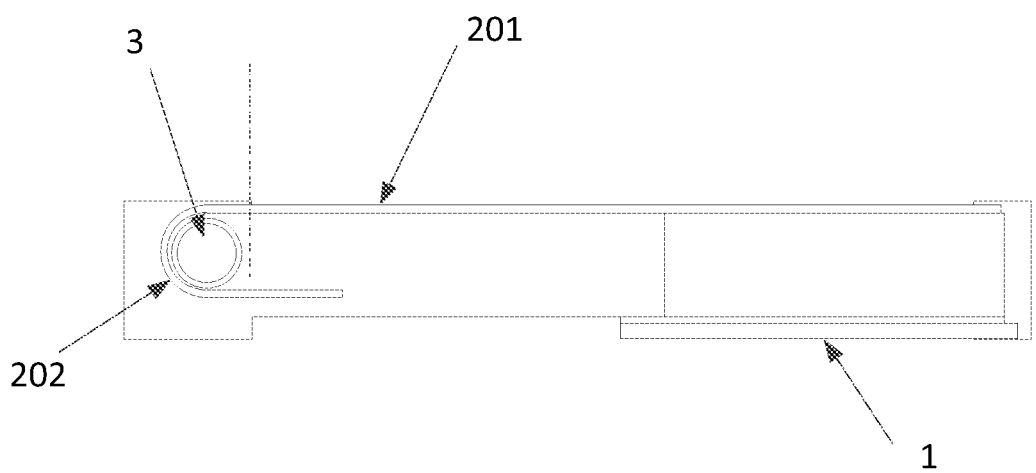
FIG. 13 is a schematic diagram showing a flexible display device in an unrolled state.

FIG. 1 is a schematic diagram showing a flexible display screen 2 in the related art, a tail end of the screen tilts up to contact with a housing 1. FIG. 12 is a schematic diagram showing a flexible display screen in a rolled state by sliding and rolling; and FIG. 13 is a schematic diagram showing a flexible display screen in an unrolled state by sliding and rolling, and in the unrolled state, the flexible display screen is exposed for displaying. Since the flexible display screen 2 rubs against the housing 1, issues such as scratch and the like may arise.

Referring to FIGS. 2 to 11, to address the above issues, the present embodiment provides a flexible display device, including: a housing 1, a flexible display screen 2, a support member 6, and a sliding-roller 3. The support member 6 is located between the flexible display screen and the sliding-roller 3, and is configured for driving the flexible display screen 2 to be rolled up on the sliding-roller 3, and the rotatable sliding-roller 3 is arranged in the housing 1, The flexible display device further includes a limiting structure provided between the support member 6 and the housing 1, the limiting structure is configured for maintaining a gap between the flexible display screen 2 and the housing 1.

With the arrangement of the limiting structure, the gap is always maintained between the flexible display screen 2 and the housing 1 during the sliding and rolling process, so as to avoid a contact between the flexible display screen 2 and the housing 1, thereby preventing issues such as scratch caused by the contact between the flexible display screen 2 and the housing 1.

As shown in FIGS. 2-8, in an exemplary embodiment, the limiting structure includes at least one rigid track 4 arranged at a side of the support member 6 away from the flexible display screen 2, the rigid track 4 is wound around the sliding-roller 3 to be in a U-shaped structure, and two opposite ends 411 and 412 of the rigid track 4 are fixed to the housing 1.

In an axial direction of the sliding-roller 3, the flexible display screen 2 has a certain length, and two ends of the flexible display screen 2 in the axial direction of the sliding-roller 3 are slidably connected to the housing 1, and there is no fixed connection in the middle region, thereby facilitating the sliding and rolling motion. In this case, when the flexible display screen 2 performs the sliding and rolling motion around the sliding-roller 3, and a part of the flexible display screen 2 slides and rolls below the sliding-roller 3 (namely, a backlight side of the display region of the flexible display screen 2), a tail end of the flexible display screen 2 will tilt up due to a rebound force, especially in a local area in the axial direction of the sliding-roller 3. With the arrangement of the rigid track 4, a force (namely, a force perpendicular to a display surface 203 of the flexible display screen) is applied to the flexible display screen 2 in a direction parallel to the light outputting direction of the flexible display screen 2, so as to prevent the flexible display screen 2 from being tilted up in a direction facing the housing, so that the flexible display screen can remain flat, and the flexible display screen 2 is prevented from being contacted with the housing 1.

It is to be noted that, the flexible display device includes a fixed portion and a retractable portion, the retractable portion can be stretched out or retracted in with respect to the fixed portion, the sliding-roller 3 and the rigid track 4 are located at the retractable portion, the rigid track 4 is slidable with the sliding of the sliding-roller 3, i.e. the rigid track 4 is retractable in a direction perpendicular to the axial direction of the sliding-roller 3.

In an exemplary embodiment, in a rolling-up direction (referring to the direction X in FIG. 2) of the flexible display screen 2, the flexible display screen 2 includes a first end 211 adjacent to the sliding-roller 3, and when the flexible display screen 2 is in a rolled-up state, an orthographic projection of the first end 211 onto the rigid track 4 is located in the rigid track 4.

The rigid track 4 functions as supporting the flexible display screen 2, maintaining the flatness of the flexible display screen 2, and ensuring a gap between the flexible display screen 2 and the housing 1 during the sliding and rolling process. The part of the flexible display screen 2 which may be easily tilted up includes the first end, and therefore the first end of the flexible display screen 2 needs to be supported by the rigid track 4, an orthographic projection of the first end onto the rigid track 4 is located in the rigid track 4, for example, an end face of the first end is flush with a corresponding end face of the rigid track 4, or an end face of the first end is located at a side of the corresponding end face of the rigid track 4 facing the sliding-roller 3, namely, the orthographic projection of the first end onto the rigid track 4 is located inside the rigid track 4.

In an exemplary embodiment, in a direction parallel to the axial direction of the sliding-roller 3, at least one rigid track 4 is arranged at intervals in a middle region of the flexible display screen 2.

Since opposite sides of the flexible display screen 2 are slidingly connected to the housing 1 in a direction parallel to the axial direction of the sliding-roller 3, but the middle region is not supported, the middle region is a region prone to tilting-up, and the provision of the rigid track 4 in this region can effectively prevent the flexible display screen from tilting up, thereby preventing the flexible display screen 2 from contacting with the housing 1.

Figure 3:
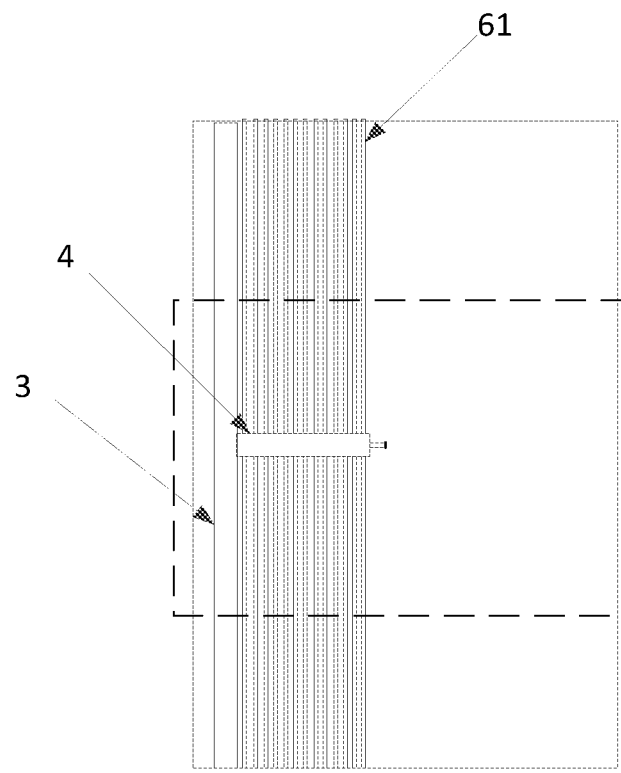
FIG. 3 is a second schematic diagram showing a structure of a flexible display device in an embodiment of the present disclosure.

The middle region may refer to a region represented by a dotted rectangle in FIG. 3, but the disclosure is not limiting thereto. Two opposite sides of the flexible display screen 2 are slidably connected to the housing 1, and it can be considered that a region between the two sides fixed to the housing 1 is the middle region.

It is to be noted that, the number of the rigid tracks 4 may be set according to the actual need.

It is to be noted that, when the number of the rigid tracks 4 is at least two, a distance between two adjacent rigid tracks 4 may be set according to the actual need.

It is to be noted that, the width of the rigid track 4 in the direction parallel to the axial direction of the sliding-roller 3 may be set according to actual needs, and when the number of the rigid track 4 is at least two, in the direction parallel to the axial direction of the sliding-roller 3, the at least two rigid tracks 4 may have identical widths, or may have different widths, or parts of the tracks may have identical widths.

In an embodiment, the flexible display screen 2 includes a first region, and the width of the rigid track 4 is greater than or equal to the width of the first region in the direction parallel to the axial direction of the sliding-roller 3, but the disclosure is not limited thereto.

In an exemplary embodiment, in an extending direction of the rigid track 4, a plurality of connecting structures 5 for connecting the rigid track 4 are provided at intervals on the support member 6.

The rigid track 4 functions as supporting the flexible display screen 2, but in order to ensure the supporting performance thereof, the rigid track 4 may perform sliding only motion (performing a retractable movement in a direction perpendicular to the axial direction of the sliding-roller 3), and cannot perform sliding and rolling motion, while the flexible display screen 2 needs to perform the sliding and rolling motion around the sliding-roller 3, and therefore the connecting structure 5 functions as connecting the rigid track 4 with the flexible display screen 2, as well as ensuring that the flexible display screen 2 can perform relative movement with respect to the rigid track 4.

Figure 6:
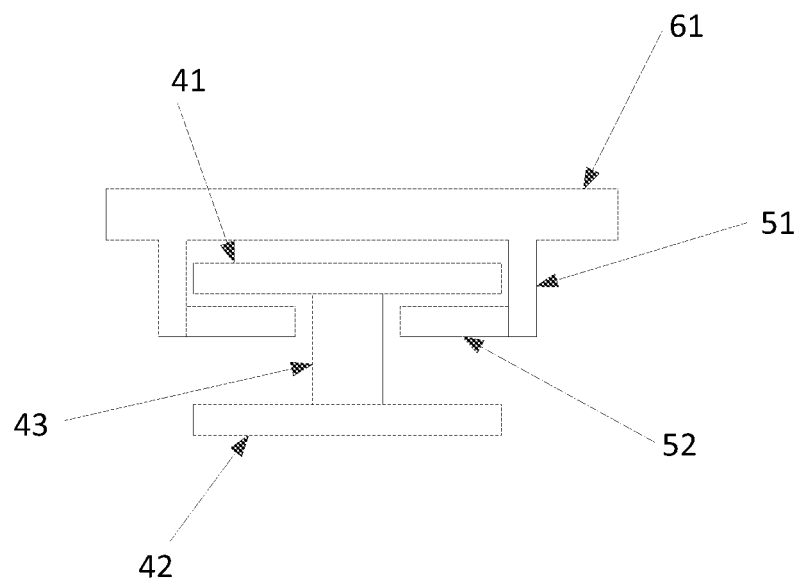
FIG. 6 is a first schematic diagram showing a rigid track in connection with a connecting structure in an embodiment of the present disclosure.

Reference is made to FIG. 6, FIG. 6 is a schematic cross-sectional view in a second direction, the second direction is perpendicular to the display surface 203 of the flexible display screen and perpendicular to the extending direction of the rigid track. In an exemplary embodiment, the connecting structure 5 includes two L-shaped connecting members arranged opposite to each other in a first direction, the L-shaped connecting member includes a first connecting rod 51 connected to the support member 6 and a second connecting rod 52 perpendicularly connected to the first connecting rod 51. The first direction is parallel to the axial direction of the sliding-roller 3, an extending direction of the first connecting rod 51 is parallel to the light outputting direction of the flexible display screen 2 (namely, the extending direction of the first connecting rod 51 is perpendicular to the display surface 203 of the flexible display screen 2), an extending direction of the second connecting rod 52 is parallel to the axial direction of the sliding-roller 3:

The rigid track 4 has a cross section of an H-shape rotated by 90 degrees in the direction parallel to the light outputting direction of the flexible display screen 2 (namely, in the direction perpendicular to the display surface 203 of the flexible display screen), and the rigid track 4 includes a first connecting plate 41 and a second connecting plate 42 opposite to each other, and includes a supporting plate 43 connected between the first connecting plate 41 and the second connecting plate 42, the first connecting plate 41 is inserted between the two L-shaped connecting members.

Illustratively, a gap is provided between the second connecting rod 52 and the supporting plate 43 to ensure that the flexible display screen 2 can slide relative to the rigid track 4.

Illustratively, in a direction perpendicular to the flexible display screen 2, the width of the second connecting rod 52 (in an example where the second connecting rod 52 is cylindrical, the width is the diameter of the second connecting rod 52) is smaller than the length of the supporting plate 43, ensuring that the second connecting rod 52 can move in a space formed by the first connecting plate 41, the second connecting plate 42 and the supporting plate 43.

Illustratively, the thickness of the first connecting plate 41 is smaller than the length of the first connection rod 51 in the direction perpendicular to the flexible display screen 2, thereby reducing the contact area between the flexible display screen 2 and the rigid track 4.

The rigid track 4 is not limited to the H-shaped structure, and in an embodiment, the rigid track 4 may be a stripe structure extending through the two L-shaped connecting members in its entirety.

Figure 7:
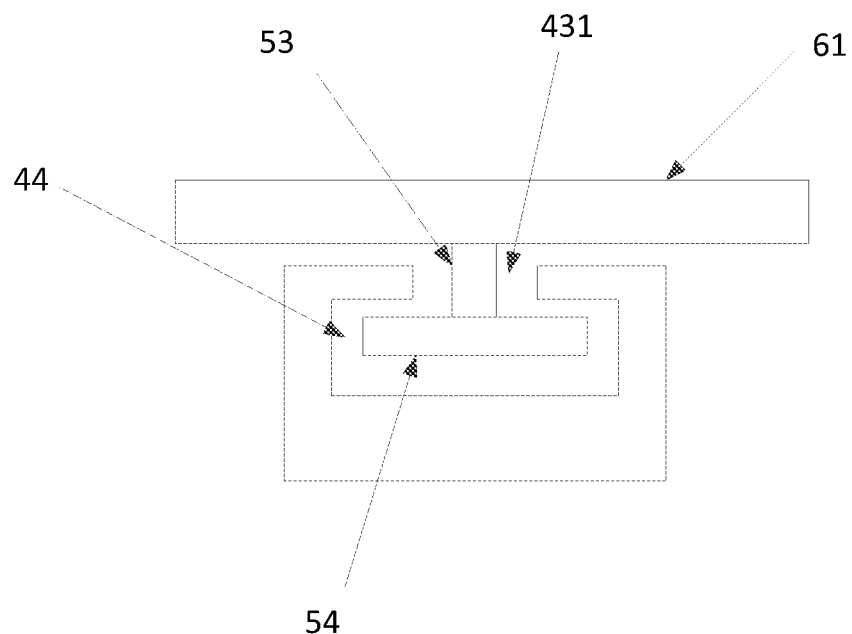
FIG. 7 is a second schematic diagram showing a rigid track in connection with a connecting structure in an embodiment of the present disclosure.

Reference is made to FIG. 7, FIG. 7 is a schematic cross-sectional view in the second direction which is perpendicular to the display surface 203 of the flexible display screen and perpendicular to the extending direction of the rigid track. In an exemplary embodiment, the connecting structure 5 includes an inverted T-shaped structure formed by connecting a third connecting rod 53 to a fourth connecting rod 54, one end of the third connecting rod 53 is connected to the support member 6, the other end of the third connecting rod 53 is connected to a middle part of the fourth connecting rod 54, an extending direction of the third connecting rod 53 is parallel to the light outputting direction of the flexible display screen 2 (namely, the extending direction of the third connecting rod 53 is perpendicular to the display surface 203 of the flexible display screen 2), and an extending direction of the fourth connecting rod 54 is parallel to the extending direction of the sliding-roller 3.

The rigid track 4 is provided with a stripe-shaped recess 44 extending in the extending direction of the rigid track 4, an opening 431 of the stripe-shaped groove 44 is provided on a connecting surface of the rigid track 4 which is adjacent to the support member 6, the opening 431 is a stripe-shaped opening extending in the extending direction of the rigid track 4 and penetrating through the rigid track 4, and the width of the opening 431 in the extending direction perpendicular to the rigid track 4 is less than the length of the fourth connecting rod 54.

The T-shaped structure extends through the stripe-shaped groove 44, and the maximum width of the third connecting rod 53 is smaller than the width of the opening in the direction perpendicular to the extending direction of the stripe-shaped groove 44, ensuring free sliding of the connecting structure 5.

In a direction perpendicular to the extending direction of the stripe-shaped groove 44 (and parallel to the direction of the flexible display screen 2), the length of the fourth connecting rod 54 is smaller than the distance between opposite inner walls of the stripe-shaped groove 44.

In the direction perpendicular to the flexible display screen 2, the maximum width of the fourth connecting rod 54 is smaller than the depth of the stripe-shaped groove 44.

Figure 8:
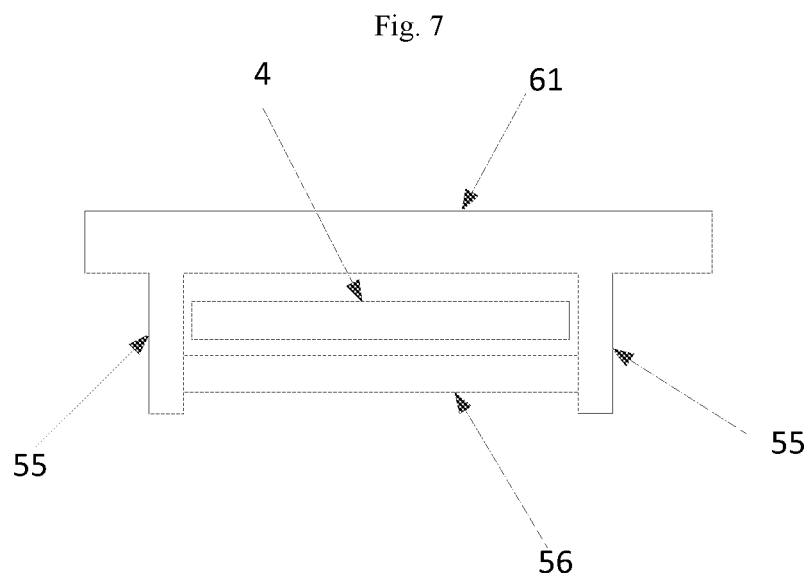
FIG. 8 is a third schematic diagram showing a rigid track in connection with a connecting structure in an embodiment of the present disclosure.

Reference is made to FIG. 8, FIG. 8 is a schematic cross-sectional view in the second direction which is perpendicular to the display surface 203 of the flexible display screen and perpendicular to the extending direction of the rigid track. In an exemplary embodiment, the connecting structure 5 includes two fifth connecting rods 55 arranged opposite to each other and parallel with each other, the fifth connecting rods 55 are arranged parallel to the light outputting direction of the flexible display screen 2 (namely, the fifth connecting rods 55 are arranged perpendicular to the display surface 203 of the flexible display screen 2), and a rotatable connecting shaft 56 is connected between the two fifth connecting rods 55.

The rigid track 4 extends between the connecting shaft 56 and the support member 6.

The arrangement of the connecting shaft 56 reduces friction when the flexible display screen 2 is moving in relative to the rigid track 4.

In an exemplary embodiment, in a direction perpendicular to the axial direction of the sliding-roller 3, the support member 6 includes a plurality of supporting bars 61 arranged at intervals, an extending direction of the supporting bars 61 is parallel to the axial direction of the sliding-roller 3, and at least part of the supporting bars 61 are provided with the connecting structure 5.

Figure 4:
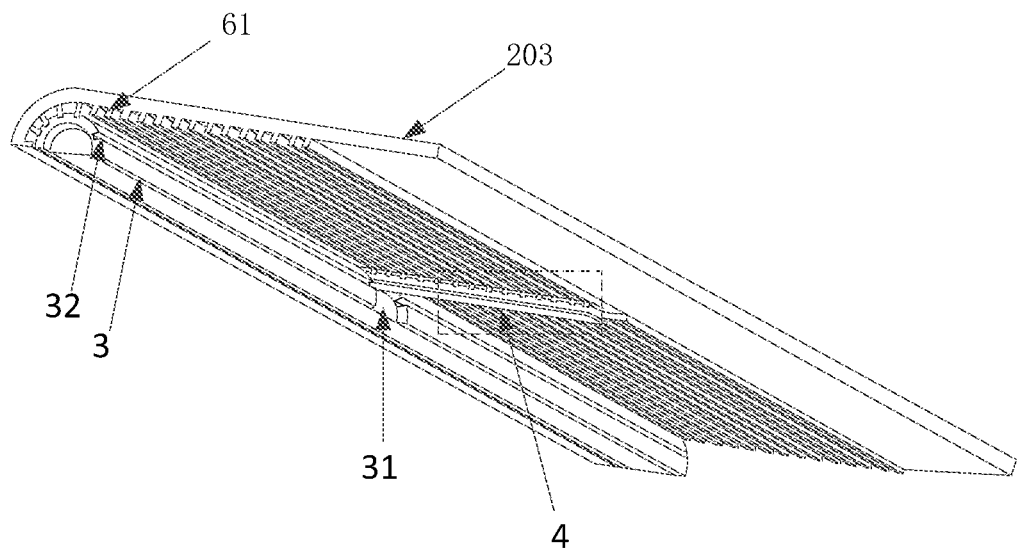
FIG. 4 is a third schematic diagram showing a structure of a flexible display device in an embodiment of the present disclosure.
Figure 5:
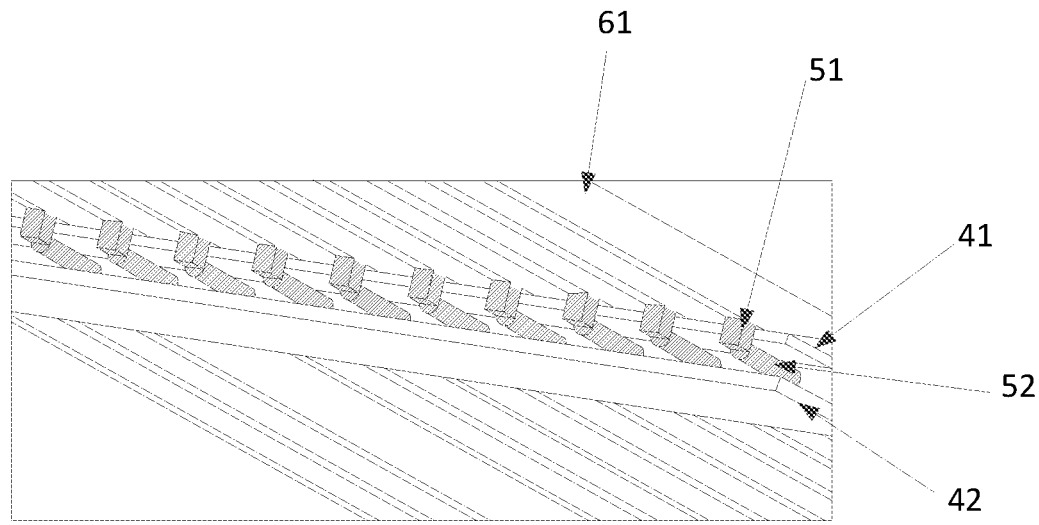
FIG. 5 is an enlarged view of a portion in FIG. 4.

In the embodiment shown in FIGS. 4 and 5 (FIG. 5 is an enlarged view of the region indicated by the dashed rectangle in FIG. 4), the connecting structure 5 is provided on each of the supporting bars 61, but the disclosure is not limited thereto.

Illustratively, in the direction perpendicular to the axial direction of the sliding-roller 3, the number of the supporting bars between two adjacent connecting structures 5 may be set according to actual needs, and may be 0, 1 or more than one, and the number of the supporting bars between different two adjacent connecting structures 5 may be the same in order to make the force is uniformly applied to the rigid track uniformly.

In an exemplary embodiment, the connecting structure 5 and the supporting bar 61 are in a one-piece structure. The connecting structure 5 and the supporting bar are formed in a single manufacturing procedure, thereby simplifying the process.

In an exemplary embodiment, an elongated clamping groove 32 matching with the supporting bar 61 is provided on an outer circumference surface of the sliding-roller 3, and at least one notch 31 which is one-to-one correspondence to the rigid track 4 is arranged on each elongated clamping groove 32 to receive the rigid track 4, referring to FIG. 4.

The elongated clamping grooves are one-to-one correspondence to elongated protrusions, so as to drive the flexible display screen 2 to slide and roll with the sliding-roller 3, and the arrangement of the notch 31 serves the function of avoiding.

In an exemplary embodiment, the support member 6 is connected to the flexible display screen 2 by an optical adhesive layer 62.

Figure 9:
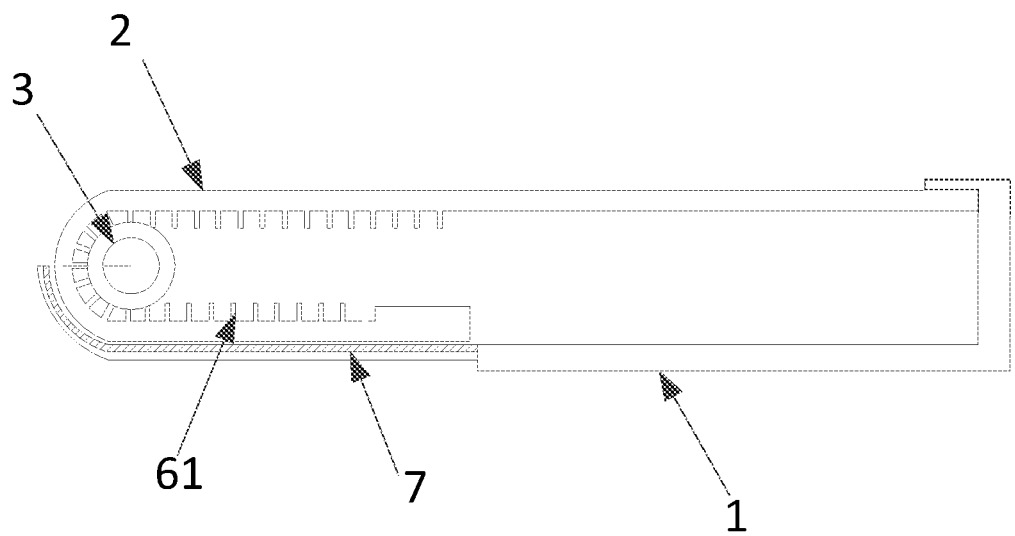
FIG. 9 is a fourth schematic diagram showing a structure of a flexible display device in an embodiment of the present disclosure.

As shown in FIGS. 9, in an exemplary embodiment, the limiting structure includes a first magnetic structure and a second magnetic structure with same magnetic polarity, the first magnetic structure is arranged at a side of the support member 6 away from the flexible display screen 2, and the second magnetic structure 7 is arranged on the housing 1.

By the arrangement of the first magnetic structure and the second magnetic structure 7, the distance between the flexible display screen 2 and the housing 1 can be maintained, thereby avoiding the contact between the flexible display screen 2 and the housing 1 by using the repulsive force due to the same magnetic polarity.

In an exemplary embodiment, the support member 6 is reused as the first magnetic structure.

The support member 6 may be made of a metal having a predetermined magnetic polarity (the same magnetic polarity as that of the second magnetic structure), so that the structure can be simplified.

Figure 10:
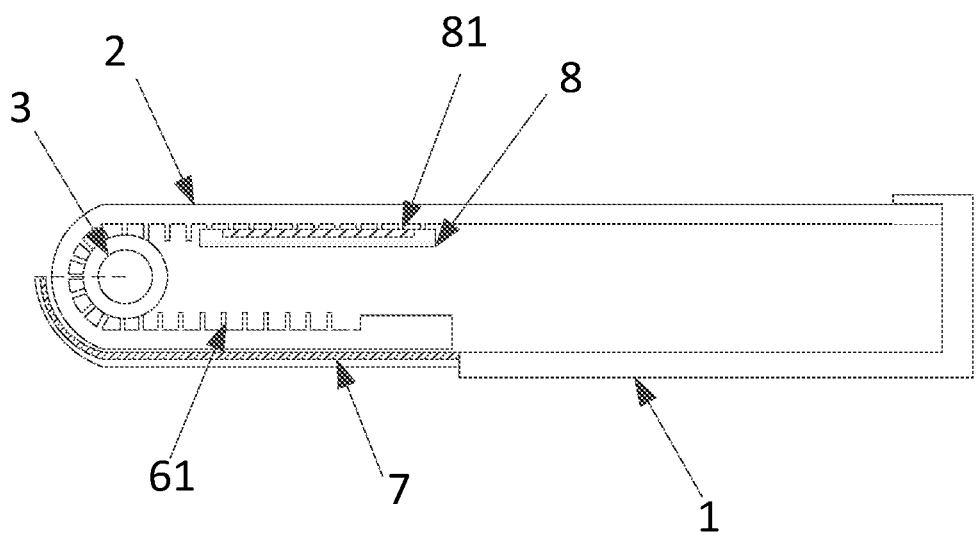
FIG. 10 is a fifth schematic diagram showing a structure of a flexible display device in an embodiment of the present disclosure.

Referring to FIGS. 10, 12 and 13, FIG. 12 shows a flexible display device in a rolled-up state, and FIG. 13 shows a flexible display device in an unrolled state. In an exemplary embodiment, the flexible display screen 2 includes a display region 201 and a non-display region 202, the non-display region 202 is wound on the sliding-roller 3, the display region 20 can be stretched out or retracted in when being driven by the sliding-roller 3. In the rolled-up state, a part of the display region slides and rolls into the housing 1, and in the unrolled state, all of the display region 201 slides and rolls to a display side for displaying. One side of the support member 6 away from the flexible display screen 2 includes a first region corresponding to the display region 201, a supporting portion 8 is provided on the first region, and the supporting portion 8 is provided with a third magnetic structure 81 with a magnetic polarity opposite to that of the first magnetic structure.

With the arrangement of the third magnetic structure 81 and the first magnetic structure, the supporting portion 8 can be closely attached to the flexible display screen 2, thereby ensuring the flatness of the flexible display screen 2.

Illustratively, the supporting portion 8 includes a plurality of sub-supporting portions arranged at intervals, and the plurality of sub-supporting portions are arranged in a comb shape, but the disclosure is not limited thereto.

Figure 11:
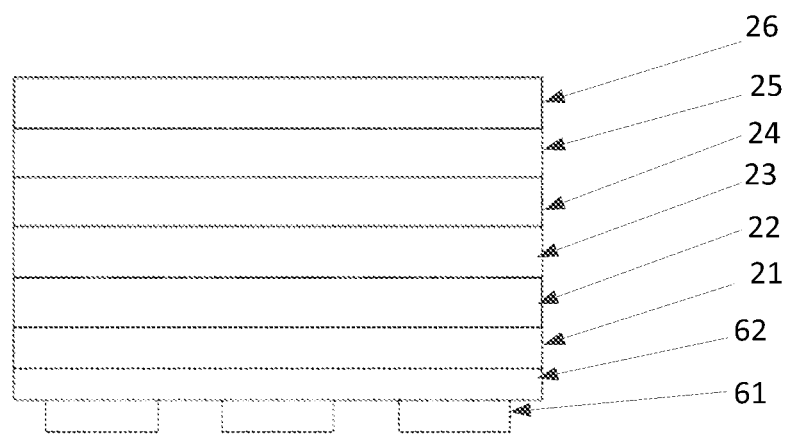
FIG. 11 is a schematic diagram showing a structure of a flexible display screen in an embodiment of the present disclosure.

Reference is made to FIG. 11, which shows a structural diagram of the flexible display screen 2, the flexible display screen 2 may include a metal supporting layer 21, a flexible spacer layer 22, a flexible display layer 23, a flexible touch layer 24, a polarizer 25, and a flexible protective layer 26. The flexible spacer layer 22 is provided on the metal supporting layer 21; the flexible display layer 23 is provided at a side of the flexible spacer layer 22 away from the metal supporting layer 21; the flexible touch control layer 24 is provided at a side of the flexible display layer 23 away from the flexible spacer layer 22; the flexible touch control layer 24 is provided at a side of the flexible display layer 23 away from the flexible spacer layer 22; the polarizer 25 is provided at a side of the flexible touch control layer 24 away from the flexible display layer 23; and the flexible protective layer 26 is provided at a side of the polarizer 25 away from the flexible touch control layer 24.

In an exemplary embodiment, the flexible protective layer 26 is made of a transparent polyimide resin.

In an exemplary embodiment, a thickness of the metal supporting layer 21 may be greater than or equal to 30 μm and be less than or equal to 40 μm, but the disclosure is not limited thereto.

A stripe-shaped supporting layer (namely, the support member 6) is provided at a side of the metal supporting layer 21 away from the flexible spacer layer 22, and the stripe-shaped supporting layer and the metal supporting layer 21 are connected by an optical adhesive layer 62.

It is to be understood that the above-described embodiments are merely exemplary embodiments that have been employed to illustrate the principles of the present disclosure, and the disclosure is not limited thereto. It will be apparent to those skilled in the art that various modifications and variations can be made without departing from the spirit or scope of the disclosure, and those modifications and variations fall within the protection scope of the disclosure.

What is claimed is:

1. A flexible display device, comprising: a housing, a flexible display screen, a support member, and a sliding-roller, wherein the support member is located between the flexible display screen and the sliding-roller, the support member is configured for driving the flexible display screen to be rolled on the sliding-roller, and the sliding-roller is rotatable and is arranged in the housing; wherein the flexible display device further comprises a limiting structure disposed between the support member and the housing, the limiting structure is configured for maintaining a gap between the flexible display screen and the housing, wherein the limiting structure comprises at least one rigid track arranged at a side of the support member away from the flexible display screen, the rigid track is wound around the sliding-roller to be in a U-shaped structure, and two opposite ends of the rigid track are fixed to the housing.

2. The flexible display device according to claim 1, wherein in a rolling-up direction of the flexible display screen, the flexible display screen comprises a first end adjacent to the sliding-roller, and an orthographic projection of the first end onto the rigid track is located in the rigid track in a case where the flexible display screen is in a rolled-up state.

3. The flexible display device according to claim 1, wherein in a direction parallel to an axial direction of the sliding-roller, the at least one rigid track is arranged at intervals in a middle region of the flexible display screen.

4. The flexible display device according to claim 1, wherein in an extending direction of the rigid track, a plurality of connecting structures for connecting the at least one rigid track are arranged at intervals on the support member.

5. The flexible display device according to claim 4, wherein the connecting structure comprises two L-shaped connecting members arranged opposite to each other in a first direction, the L-shaped connecting members comprise a first connecting rod connected to the support member and a second connecting rod which is perpendicular to the first connecting rod and connected with the first connecting rod, the first direction is parallel to an axial direction of the sliding-roller, an extending direction of the first connecting rod is perpendicular to a display surface of the flexible display screen, and an extending direction of the second connecting rod is parallel to the axial direction of the sliding-roller; and in a direction perpendicular to the display surface of the flexible display screen, a cross section of the rigid track has an H-shape rotated by 90 degrees, the rigid track comprises a first connecting plate, a second connecting plate, and a supporting plate connected between the first and second connecting plates, the first connecting plate being inserted between the two L-shaped connecting members.

6. The flexible display device according to claim 4, wherein the connecting structure comprises an inverted T-shaped structure comprising a third connecting rod and a fourth connecting rod connected with each other, one end of the third connecting rod is connected to the support member, the other end of the third connecting rod is connected to a middle part of the fourth connecting rod, an extending direction of the third connecting rod is perpendicular to a display surface of the flexible display screen, and an extending direction of the fourth connecting rod is parallel to an extending direction of the sliding-roller; and the rigid track is provided with an stripe-shaped groove extending in the extending direction of the rigid track, an opening of the stripe-shaped groove is disposed on a connecting surface of the rigid track adjacent to the support member, the opening is a stripe-shaped opening extending in the extending direction of the rigid track and penetrating through the rigid track, and a width of the opening in a direction perpendicular to the extending direction of the rigid track is less than a length of the fourth connecting rod.

7. The flexible display device according to claim 4, wherein the connecting structure comprises two fifth connecting rods arranged opposite to each other and parallel with each other, the two fifth connecting rods are arranged to be perpendicular to a display surface of the flexible display screen, and a rotatable connecting shaft is connected between the two fifth connecting rods; and the rigid track is extending between the connecting shaft and the support member.

8. The flexible display device according to claim 4, wherein in a direction perpendicular to an axial direction of the sliding-roller, the support member comprises a plurality of supporting bars arranged at intervals, an extending direction of the plurality of supporting bars is parallel to the axial direction of the sliding-roller, and at least a part of the plurality of supporting bars is provided with the connecting structure.

9. The flexible display device according to claim 8, wherein the connecting structure and the supporting bar is a one-piece structure.

10. The flexible display device according to claim 8, wherein an elongated clamping groove matching with the supporting bar is provided on an outer circumference surface of the sliding-roller, and at least one notch which is in one-to-one correspondence to the at least one rigid track is arranged on each stripe-shaped groove to receive the at least one rigid track.

11. The flexible display device according to claim 8, wherein the support member is connected to the flexible display screen by an optical adhesive layer.

12. The flexible display device according to claim 1, wherein the limiting structure comprises a first magnetic structure and a second magnetic structure having the same magnetic polarity, the first magnetic structure is arranged at a side of the support member away from the flexible display screen, and the second magnetic structure is arranged on the housing.

13. The flexible display device according to claim 12, wherein the support member is reused as the first magnetic structure.

14. The flexible display device according to claim 12, wherein the flexible display screen comprises a display region and a non-display region, the non-display region is wound on the sliding-roller, the display region is capable of being stretched out or retracted in when being driven by the sliding-roller, the side of the support member away from the flexible display screen comprises a first region corresponding to the display region, a supporting portion is disposed on the first region, and a third magnetic structure having a magnetic polarity opposite to the magnetic polarity of the first magnetic structure is disposed on the supporting portion.

15. A display terminal, comprising a flexible display device, wherein the flexible display device comprises a housing, a flexible display screen, a support member, and a sliding-roller, wherein the support member is located between the flexible display screen and the sliding-roller, the support member is configured for driving the flexible display screen to be rolled on the sliding-roller, and the sliding-roller is rotatable and is arranged in the housing; wherein the flexible display device further comprises a limiting structure disposed between the support member and the housing, the limiting structure is configured for maintaining a gap between the flexible display screen and the housing;

wherein the limiting structure comprises at least one rigid track arranged at a side of the support member away from the flexible display screen, the rigid track is wound around the sliding-roller to be in a U-shaped structure, and two opposite ends of the rigid track are fixed to the housing.

16. The display terminal according to claim 15, wherein in an extending direction of the rigid track, a plurality of connecting structures for connecting the at least one rigid track are arranged at intervals on the support member.

17. The display terminal according to claim 15, wherein the limiting structure comprises a first magnetic structure and a second magnetic structure having the same magnetic polarity, the first magnetic structure is arranged at a side of the support member away from the flexible display screen, and the second magnetic structure is arranged on the housing.

18. The display terminal according to claim 17, wherein the flexible display screen comprises a display region and a non-display region, the non-display region is wound on the sliding-roller, the display region is capable of being stretched out or retracted in when being driven by the sliding-roller, the side of the support member away from the flexible display screen comprises a first region corresponding to the display region, a supporting portion is disposed on the first region, and a third magnetic structure having a magnetic polarity opposite to the magnetic polarity of the first magnetic structure is disposed on the supporting portion.

\* \* \* \* \*